United States Patent [19]

Lang

[11] Patent Number: 5,537,024

[45] Date of Patent: Jul. 16, 1996

[54] CIRCUIT ARRANGEMENT TO DETECT A VOLTAGE

[75] Inventor: Gerhard Lang, Altweilnau, Germany

[73] Assignee: Braun Aktiengesellschaft, Frankfurt, Germany

[21] Appl. No.: 204,398

[22] PCT Filed: Jul. 30, 1992

[86] PCT No.: PCT/DE92/00642

§ 371 Date: Mar. 15, 1994

§ 102(e) Date: Mar. 15, 1994

[87] PCT Pub. No.: WO93/06492

PCT Pub. Date: Apr. 1, 1993

[30] Foreign Application Priority Data

Sep. 20, 1991 [DE] Germany ............ 41 31 417.4

[51] Int. Cl.$^6$ .................. H01M 10/48; G01N 27/416; G08B 21/00
[52] U.S. Cl. .............................. 320/48; 340/661
[58] Field of Search .................. 324/429, 433; 340/663, 661; 320/48

[56] References Cited

U.S. PATENT DOCUMENTS 3,670,246  6/1972  Gately ........................... 324/133
4,429,236  1/1984  Nitschke ........................ 340/663
4,445,090  4/1984  Melocik et al. ................. 324/433
4,758,772  7/1988  Lang ............................ 320/48
4,829,290  5/1989  Ford ............................ 340/663
4,906,055  3/1990  Horiuchi ........................ 307/354

*Primary Examiner*—Peter S. Wong
*Assistant Examiner*—Patrick B. Law
*Attorney, Agent, or Firm*—Fish & Richardson

[57] ABSTRACT

In a circuit arrangement to detect a voltage (U), the voltage is applied to the input of a voltage detector (VD) through a voltage divider (R1, R4), the voltage detector (VD) comprising a Schmitt-Trigger with reference voltage and an output driver. The output signal of the voltage detector (VD) is applied to the base of a transistor (T1) whose collector-emitter circuit, together with a series-connected capacitor (C1), is connected in parallel with the voltage (U) to be detected. The junction of the capacitor (C1) and the transistor (T1) is connected to the input of the voltage detector (VD) through a resistor (R5, R6). The output of the voltage detector (VD) is further applied to the input of a component (C) delivering different output signals in dependence upon whether its input receives a constant signal level or a varying signal level.

10 Claims, 2 Drawing Sheets

CIRCUIT ARRANGEMENT TO DETECT A VOLTAGE

This invention relates to a circuit arrangement to detect a voltage, including a voltage divider having applied to its divider node the input of a voltage detector which comprises a Schmitt-Trigger with reference voltage and an output driver, with the output of the voltage detector being connected to the positive potential of the voltage.

Voltage detectors comprising internally a Schmitt-Trigger with reference voltage and an output driver are commercially available devices. FIG. 4 illustrates the wiring of such a voltage detector VD when a specified voltage, for example, the voltage of two serially connected battery cells or accumulator cells (B), is to be detected which is greater than the internal reference voltage of the voltage detector VD. In this event, a voltage divider comprised of resistors R1 and R4 is connected in parallel with the battery B, and the junction of the two resistors R1 and R4 is connected to the IN input of the voltage detector VD. The OUT output of the voltage detector VD is applied to the positive potential of the battery B through a resistor R2. The voltage divider R1/R4 is so dimensioned that the internal reference voltage (2.1 volts, for example) will be present at the IN input of the voltage detector VD when the voltage to be detected (2.3 volts, for example) is present at the battery B. When the battery voltage drops below-this value, the output of the voltage comparator VD will go from "high" to "low".

However, such commercially available voltage detectors have the disadvantage of having a hysteresis of, for example, 0.1 volts. This means that with the battery voltage falling the output of the voltage detector VD will go from "high" to "low" when the voltage at the input reaches 2.1 volts (correspondingly 2.3 volts at the battery), however, with the battery voltage rising (for example, when the battery is being recharged), the output of the voltage detector VD will not reverse its state until the voltage at the input reaches 2.2 volts (2.1 volts+0.1 volts). This is not satisfactory for some applications requiring an accurate voltage detection as, for example, when it is desired to detect a specified voltage accurately on a battery during both discharging and charging of the battery.

It is therefore an object of the present invention to configure a circuit arrangement of the type initially referred to in such a manner as to permit a hysteresis-free detection of a specified voltage.

According to the present invention, this object is accomplished in that the output signal of the voltage detector is applied to the base of a first transistor, that the collector-emitter circuit, together with a series-connected capacitor, is connected in parallel with the voltage to be detected, that the junction of the capacitor and the first transistor is connected to the input of the voltage detector through a first resistor, and that the output of the voltage detector is further applied to the input of a component delivering different output signals in dependence upon whether its input receives a constant signal level or a varying signal level.

When it is desired to detect several specified voltages using the same voltage detector or to be able to vary the value of the voltage to be detected, the resistor of the first voltage divider connected to reference potential is comprised of a second voltage divider to which an integrating capacitor is connected in parallel and whose divider node receives a square-wave voltage whose pulse duty factor is variable.

Further advantageous embodiments of the present invention will become apparent from the other subclaims and the subsequent description.

Embodiments of the present invention will now be described in more detail in the following with reference to the accompanying drawings, in which.

Figure 1:
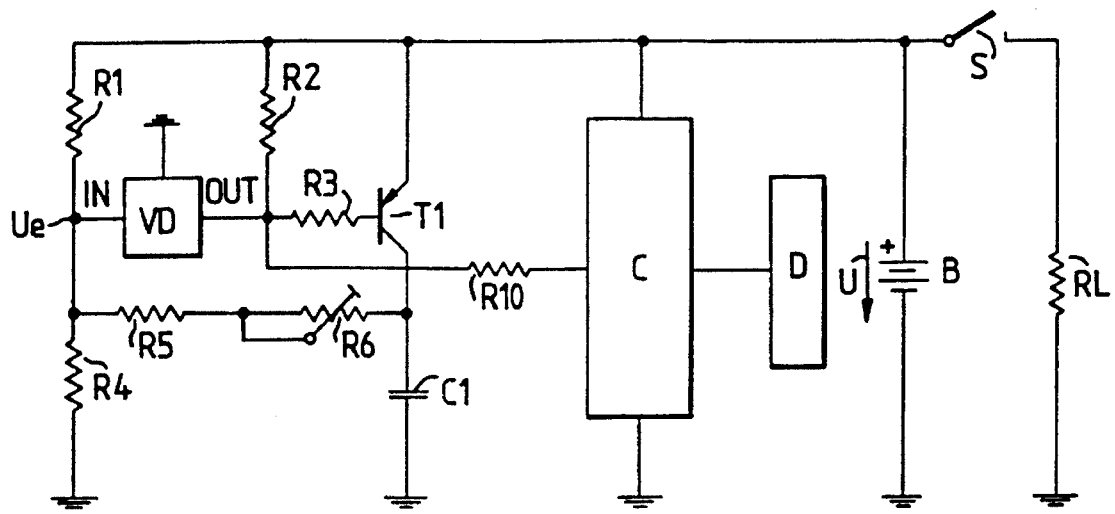
FIG. 1 is a schematic diagram showing a circuit arrangement for detecting a specified voltage value on a battery.

Referring now to FIG. 1 of the drawings, there is shown a circuit arrangement providing a suitable indication when the voltage U of the battery B has reached a specified value. A load resistor RL may be connected to this battery (accumulator) through a switch S. This load resistor may be the motor of a small electrical appliance as, for example, an electric shaver. The battery is rechargeable by means of a charging circuitry not shown.

Connected in parallel with the battery B is a voltage divider comprised of resistors R1 and R4, by means of which the voltage U of the battery B is divided down to the voltage Ue residing at the junction of the resistors R1 and R4 which is applied to the IN input of the voltage detector VD. The OUT output of the voltage detector VD is connected to the positive terminal of the battery B through a resistor R2, to the base of a transistor T1 through a resistor R3, and to the microprocessor C driving a display device D through a resistor R10.

The emitter of transistor T1 is connected to the positive terminal of the battery B, its collector being connected to reference potential through a capacitor C1. In addition, the collector is connected to the junction of the resistors R1 and R4 of the voltage divider through resistors R5 and R6. The resistor R6 is of the variable type for adjustment.

The voltage divider R1/R4 is dimensioned such as to ensure that, when the battery B reaches a specified voltage U, the divided-down voltage Ue at the IN input of the voltage detector VD lies below the detection voltage of the voltage detector VD. This specified voltage U may be, for example, the "low charge" point at 2.3 volts (in which event the battery is discharged to 10% to 20% of its capacity). When the detection voltage of the voltage detector is, for example, 2.1 volts and the tolerance is ±0.1 volts (which has no relation to the hysteresis of the voltage detector), these are 2.0 volts.

The mode of function of the circuit arrangement is as follows: When the battery voltage U has dropped to the voltage to be detected which is, for example, 2.3 volts, the voltage Ue at the IN input of the voltage detector VD will be 2.0 volts, and the OUT output of the voltage detector VD will change from "high" to "low". "Low" is the active state of the voltage detector VD. Transistor T1 will then conduct, causing the series arrangement comprised of the resistors R5, R6 to be connected in parallel with resistor R1. The input voltage Ue (divider voltage) is thereby increased to a value greater than the detection voltage of the voltage detector plus the hysteresis voltage, causing the voltage detector to assume the reverse state again (release voltage) and the OUT output to return to "high". The transistor T1 is again non-conducting, cancelling the parallel connection of resistors R5, R6 to resistor R1, whereby the divider voltage Ue is again below the detection voltage of the voltage detector VD, and the OUT output is again changed to "low".

The circuitry oscillates. The capacitor C1 provides time delays for the transition operations, thus reducing the oscillation frequency to about 1 kHz, for example. A square-wave voltage with an amplitude of the order of the battery voltage U is present at the OUT output.

Oscillation will cease to be possible when the release voltage of the voltage detector is no longer attained with the transistor T1 conducting. At this instant, the state of the voltage detector VD will be maintained, its output voltage being constantly at "low". This voltage point is adjusted by means of resistor R6.

Thus, it is possible to detect a specified value of the supply voltage solely by the presence of a constant signal level at the output of the voltage detector VD with respect to a varying (oscillating) voltage level. The specified voltage value is detected without hysteresis, that is, it is irrelevant whether the specified voltage value is reached starting from higher or from lower voltage values, since it is not the internal reference voltage of the voltage detector (2.1 volts) that is used for adjustment, but rather its release voltage.

Figure 2:
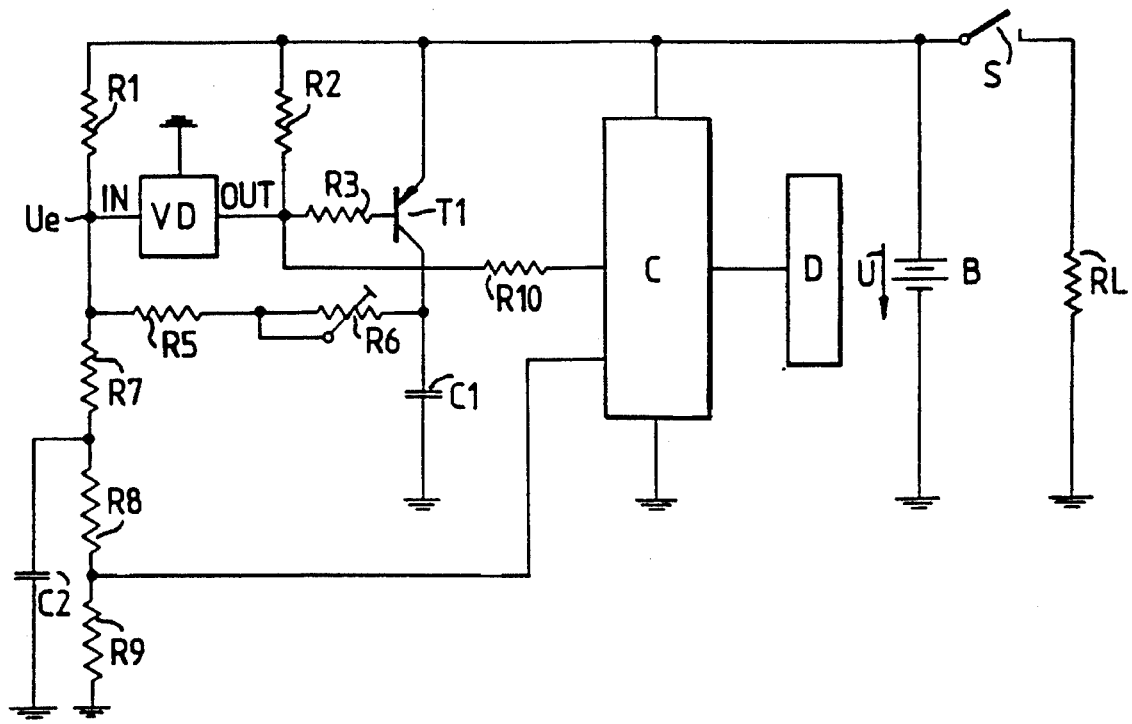
FIGS. 2 and 3 are schematic diagrams showing circuit arrangements for detecting several voltage values using a single voltage detector.
Figure 3:
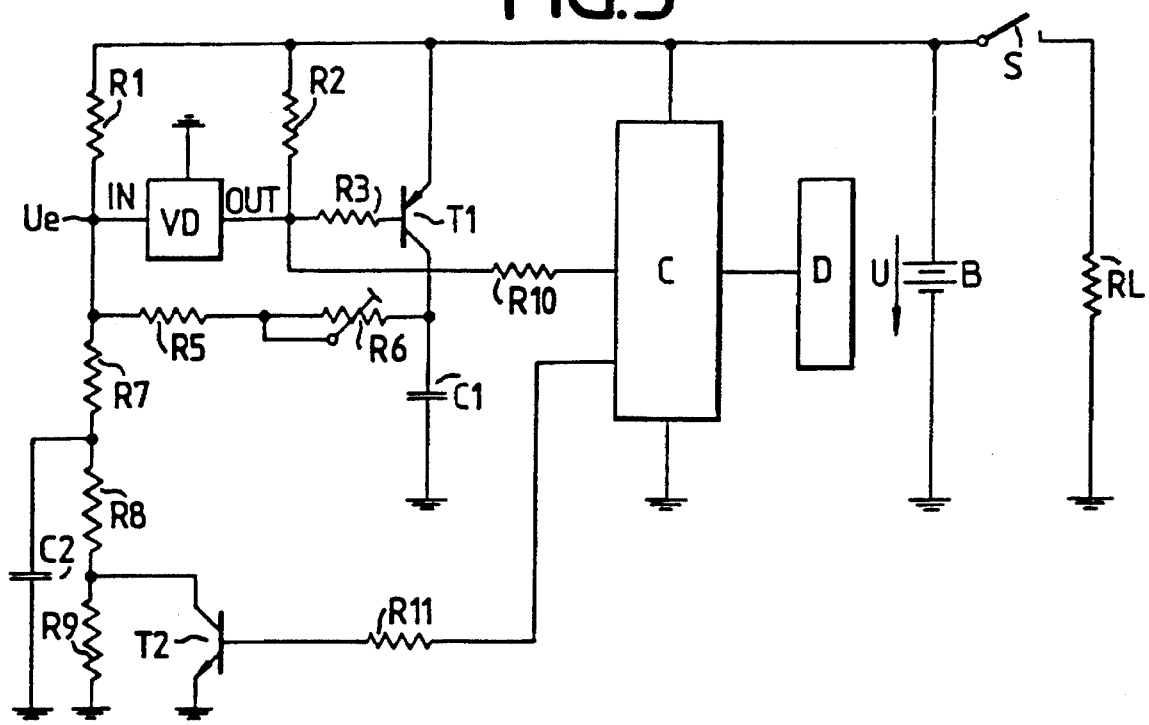

The circuit arrangements of FIGS. 2 and 3 present an extension of FIG. 1 to cover the detection of several voltages using just a single voltage detector VD. In these Figures, the resistor R4 of FIG. 1 is subdivided into serially connected resistors R7, R8 and R9, whereof resistor R7 is connected to the input of the voltage detector VD, while resistor R9 is tied to reference potential. An integrating capacitor C2 is connected in parallel with the series arrangement comprised of resistors R8 and R9.

In FIG. 2, an output of the microprocessor C is connected to the junction of resistors R8 and R9. The microprocessor supplies to this junction a square-wave control signal whose pulse duty factor is variable.

Owing to this variable pulse duty factor, in combination with the resistors R7, R8, R9 and the integrating capacitor C2, the release voltage point of the voltage detector VD can be shifted over a wide range of the voltage U of the battery B. The greater the pulse duty factor of the square-wave voltage supplied, that is, the greater the pulse/no-pulse ratio, the higher the mean value of the voltage supplied. Correspondingly, the voltage at the junction of capacitor C2 and resistor R8, and consequently also the voltage Ue at the input of the voltage detector VD, are raised, whereby the release voltage of the voltage detector is reached at higher battery voltages U.

As described with reference to FIG. 1, it is thus possible to determine and detect any desired number of voltage points of the battery voltage U by varying the pulse duty factor of the square-wave voltage supplied. By sensing a voltage point and subsequently specifying a next voltage point by correspondingly varying the pulse duty factor of the square-wave voltage supplied, the voltage characteristic of a battery during charging and/or discharging can be retraced in dependence on time.

By allocating specified voltage points of a discharging or charging characteristic of the battery (for example, between 2.5 volts and 2.2 volts at 50 mV intervals) to a visual signal of the display device D, the current charging condition of the battery is displayed. Where a display device D comprising several segments is employed, the segments are controlled by the microprocessor C such that in the fully charged condition (highest detected voltage), all segments are driven, whilst with the battery charge near depletion (lowest detected voltage), no segment is driven.

Where the display device D provides a continuous indication of the charging condition on a time basis, that is, in dependence on the period of time during which the load resistor RL (load) was connected to the battery or the battery was charged, the voltage points detected in operation will be compared to the values of the battery charging and discharging characteristic stored in the microprocessor, and if a deviation is established, the display will be corrected correspondingly.

FIG. 3 shows a circuit arrangement suitable for the event that the voltage divider is not sufficiently high-resistance, that is, the output of the microprocessor C supplying the square-wave voltage is not in a position to provide the requisite power. In this case, the square-wave signal of the microprocessor C will be delivered through a resistor R11 to the base of a transistor T2 whose collector-emitter circuit is in parallel with the resistor R9. In accordance with the pulse duty factor of the square-wave signal supplied, the transistor T2 is rendered either conducting or non-conducting. In all other respects, the mode of function of the circuit arrangement is the same as that of FIG. 2.

All circuit arrangements described in the foregoing are self-oscillating, requiring no control voltages from an external source. In consequence of the low current requirements, the circuit arrangements may remain connected to the supply voltage U also with the appliance turned off (load resistor RL disconnected from the battery), without the battery discharging unacceptably.

I claim:

1. A circuit arrangement to detect a voltage (U), comprising a transistor having a base and a collector-emitter circuit, a capacitor connected in series with said collector-emitter circuit, a voltage detector that has an input and an output, circuitry connecting said voltage detector output to the positive potential of said voltage (U), a first voltage divider having a divider node, circuitry connecting said voltage detector input to said divider node, circuitry for applying the output of said voltage detector to said base of said transistor, circuitry connecting said collector-emitter circuit and said capacitor in parallel with said voltage (U) to be detected, a first resistance connecting the junction of said capacitor and said transistor to said input of said voltage detector, and output circuitry connected to said output of said voltage detector for delivering different output signals in dependence upon whether said voltage detector input receives a constant signal level or a varying signal level.

2. The circuit arrangement of claim 1 wherein said output circuitry includes a display device (D) responsive to said voltage detector output such as to indicate whether the detected voltage (U) has reached a specified voltage or lies above or below the specified voltage value.

3. A circuit arrangement of claim 1 wherein part of said first resistance is adjustable.

4. The circuit arrangement of claim 1 wherein a portion of said first voltage divider includes a second voltage divider that has a divider node and further including circuitry connecting a reference potential to said first voltage divider, an integrating capacitor connected in parallel with said second voltage divider, and a component connected to said divider node of said voltage divider for delivering a square-wave voltage to said output circuitry.

5. The circuit arrangement of claim 4 wherein said component is part of a microprocessor.

6. The circuit arrangement of claim 1 or claim 4 wherein said output circuitry includes a microprocessor (C).

7. The circuit arrangement of claim 4 and further including a second resistor connected between said second voltage divider and said input of said voltage detector.

8. The circuit arrangement of claim 8 wherein the pulse duty factor of said square-wave voltage is variable.

9. The circuit arrangement of claim 8 wherein different values of the voltage (U) are specified by means of varying pulse duty factors of said square-wave voltage, and further including a display device (D) for providing an indication when a particular voltage value is reached.

10. The circuit arrangement of claim 8 wherein said voltage (U) to be detected is the voltage of a battery (B), different values of said battery voltage are specified by means of varying pulse duty factors of said square-wave voltage, and further including comparing said battery voltage values to a known charging/discharging characteristic of said battery, and adjusting a time-controlled charge-status indication when a deviation from said charging/discharging characteristic is established.

* * * * *

UNITED STATES PATENT AND TRADEMARK OFFICE
CERTIFICATE OF CORRECTION

Figure 4:
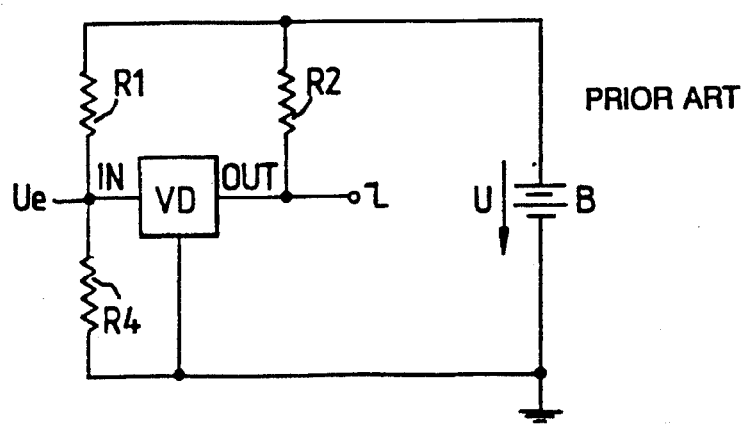
FIG. 4 is a schematic diagram of a commercially available voltage detector.

PATENT NO.   : 5,537,024
DATED        : July 16, 1996
INVENTOR(S)  : Gerhand Lang It is certified that error appears in the above-identified patent and that said Letters Patent is hereby corrected as shown below:

Col. 2, line 8, please begin new paragraph with Fig. 4.

Col. 4, line 41, after "specified voltage, please insert --value--

Co. 4, line 60, delete "8" and replace with --4--.

Signed and Sealed this

Sixteenth Day of December, 1997

Attest:

Attesting Officer

BRUCE LEHMAN

Commissioner of Patents and Trademarks